(12) United States Patent
Liu (10) Patent No.: US 9,997,580 B2
(45) Date of Patent: Jun. 12, 2018

(54) PIXEL STRUCTURE AND MANUFACTURING METHOD THEREOF, ARRAY SUBSTRATE, DISPLAY DEVICE

(71) Applicant: BOE TECHNOLOGY GROUP CO., LTD., Beijing (CN)

(72) Inventor: Libin Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days. days.

(21) Appl. No.: 14/891,926

(22) PCT Filed: Apr. 10, 2015

(86) PCT No.: PCT/CN2015/076267
§ 371 (c)(1),
(2) Date: Nov. 17, 2015

(87) PCT Pub. No.: WO2016/078297
PCT Pub. Date: May 26, 2016

(65) Prior Publication Data
US 2016/0358993 A1    Dec. 8, 2016

(30) Foreign Application Priority Data
Nov. 18, 2014   (CN) .......................... 2014 1 0660014

(51) Int. Cl.
*H01L 27/32*    (2006.01)
*H01L 21/77*    (2017.01)

(52) U.S. Cl.
CPC .......... *H01L 27/3265* (2013.01); *H01L 21/77* (2013.01); *H01L 27/3246* (2013.01); *H01L 27/3276* (2013.01); *H01L 2227/323* (2013.01)

(58) Field of Classification Search
CPC ..... H01L 27/3265; H01L 21/77; H01L 27/32; H01L 27/3246; H01L 27/3276; H01L 2227/232
See application file for complete search history.

(56) References Cited

U.S. PATENT DOCUMENTS 8,502,216 B2 *   8/2013   Akimoto ........... H01L 29/66742
                                                      257/40
9,385,171 B2 *   7/2016   Gai .......................... G09G 3/32
(Continued)

FOREIGN PATENT DOCUMENTS

CN         101123222         2/2008
CN         101308296         11/2008
(Continued)

OTHER PUBLICATIONS

Written Opinion of the International Searching Authority from corresponding PCT Application PCT/CN2015/076267 (4 pages); dated Aug. 11, 2015.
(Continued)

*Primary Examiner* — Peter Bradford
(74) *Attorney, Agent, or Firm* — Harness, Dickey & Pierce, P.L.C.

(57) ABSTRACT

A pixel structure and a manufacturing method thereof, an array substrate and a display device are disclosed, which relate to display technology and solve the problem of low light extraction rate of the existing array substrate. The pixel structure comprises a display area and a transparent area, and further comprises a pixel circuit which includes an organic electroluminescence device and at least one storage capacitor. The organic electroluminescence device is arranged in the display area and the at least one storage capacitor is arranged in the transparent area. A first polar plate and a second polar plate of the respective storage capacitors are both made of a transparent conductive mate-
(Continued)

rial, and the first and second polar plates are electrically isolated by at least a dielectric layer.

17 Claims, 7 Drawing Sheets

(56) References Cited

U.S. PATENT DOCUMENTS

| | | | | |
|---|---|---|---|---|
| 2003/0141811 A1* | 7/2003 | Park | ............... | H01L 27/1255 |
| | | | | 313/506 |
| 2013/0207099 A1* | 8/2013 | Shu | ............... | H01L 27/326 |
| | | | | 257/43 |
| 2013/0334524 A1* | 12/2013 | Miyake | ............... | H01L 27/1244 |
| | | | | 257/43 |
| 2016/0315133 A1* | 10/2016 | Sato | ............... | H01L 27/3265 |

FOREIGN PATENT DOCUMENTS

| | | |
|---|---|---|
| CN | 103247657 | 8/2013 |
| CN | 103515395 | 1/2014 |
| CN | 104081507 | 10/2014 |
| CN | 104377230 | 2/2015 |
| CN | 204155934 | 2/2015 |

OTHER PUBLICATIONS

Office Action from corresponding Chinese Application No. 201410660014.6 (9 pages); dated Sep. 20, 2016.

* cited by examiner

PIXEL STRUCTURE AND
MANUFACTURING METHOD THEREOF,
ARRAY SUBSTRATE, DISPLAY DEVICE

TECHNICAL FIELD

The present invention relates to display technology, and particularly relates to a pixel structure and a manufacturing method thereof, an array substrate, and a display device.

BACKGROUND

With development of the display technology, a demand on display image quality is increasing. Also a demand on flat display devices with high image quality and high resolution is popular, and display panel manufacturers pay more and more attention hereto.

An existing pixel structure of an organic electroluminescence display panel for transparent display comprises a display area and a transparent area. Also the pixel structure comprises a pixel circuit which includes a thin film transistor, a storage capacitor and an organic electroluminescence device. The thin film transistor, storage capacitor and organic electroluminescence device are all arranged in the display area. In the case where a size of a display panel is fixed, the bigger the display area is, the smaller the transparent area is. In the existing organic electroluminescence display panel, a first polar plate and a second polar plate of the storage capacitor are usually formed respectively together with an active layer and a gate of the thin film transistor in the same patterning process with the same material, which means that the place where the storage capacitor is formed is non-transparent.

The pixel circuit structure in the organic electroluminescence display panel is more complex than that of a Liquid Crystal Display (LCD). It usually includes a plurality of thin film transistors and capacitors, which requires a larger display area to arrange electronic elements of the pixel circuit structure and thus results in the larger pixel size. Therefore, the existing organic electroluminescence display panel for transparent display has lower resolution, and the increase of the display area would decrease the transparent area so that the whole transparency of the display panel is low.

The inventors found in the prior art that, as the first and second polar plates of the storage capacitor are made of the same non-transparent materials respectively as the active layer and the gate, the first and second polar plates of the storage capacitor are both non-transparent, which impacts the transparency of the display panel. Moreover the storage capacitor arranged in the display area would result in the excessive pixel size and cannot achieve the transparent display with high resolution.

SUMMARY

Embodiments of the present invention are directed to the above mentioned problems of the existing organic electroluminescence display panel, and provide a pixel structure with larger display area and a manufacturing method thereof, an array substrate having the pixel structure, and a display device having the array substrate.

According to an embodiment of the present invention, there is provided a pixel structure which comprises a display area, a transparent area, and a pixel circuit which includes an organic electroluminescence device and at least one storage capacitor. The organic electroluminescence device is arranged in the display area. The at least one storage capacitor of the pixel circuit is arranged in the transparent area. A first polar plate and a second polar plate of the storage capacitor are both made of a transparent conductive material, and the first and second polar plates are electrically isolated by at least a dielectric layer.

As the storage capacitor of the pixel structure is arranged in the transparent area, which means that the place where the storage capacitor is arranged is transparent, the light extraction rate of the pixel structure can be improved. Moreover, as the display area is decreased, the resolution can be also improved.

In an embodiment, the first polar plate of the storage capacitor and an anode of the organic electroluminescence device are arranged at the same layer and are made of the same material.

In an embodiment, the pixel structure further comprises a connection electrode which is electrically connected to the second polar plate of the storage capacitor, and the connection electrode and the anode of the organic electroluminescence device are arranged at the same layer and are made of the same material.

In an embodiment, a first insulating layer is arranged under a layer at which the anode of the organic electroluminescence device is arranged and in at least the transparent area, and the first polar plate of the storage capacitor is arranged under the first insulating layer.

In an embodiment, there is a step between a part of at least one layer structure in the display area and another part of the at least one layer structure in the transparent area, under a layer at which a cathode of the organic electroluminescence device is arranged.

In an embodiment, the second polar plate of the storage capacitor and the cathode of the organic electroluminescence device are separately arranged at the same layer and are made of the same material.

In an embodiment, the pixel structure further comprises a passivation layer which is arranged below the anode of the organic electroluminescence device, wherein a thickness of a part of the passivation layer in the display area is larger than a thickness of another part of the passivation layer in the transparent area.

In an embodiment, the dielectric layer comprises at least one of a first insulating layer, a pixel define layer and a planarization layer.

According to an embodiment of the present invention, there is provided a manufacturing method for a pixel structure, the pixel structure comprising a display area, a transparent area and a pixel circuit which includes an organic electroluminescence device and at least one storage capacitor. The manufacturing method comprises: forming the organic electroluminescence device in the display area; and forming the at least one storage capacitor in the transparent area. A first polar plate and a second polar plate of the storage capacitor are both made of a transparent conductive material, and the first and second polar plates are electrically isolated by a dielectric layer.

In an embodiment, the anode of the organic electroluminescence device and the first polar plate of the storage capacitor are formed in the same patterning process.

In an embodiment, a pattern of a connection electrode is formed when the anode of the organic electroluminescence device is formed, and the connection electrode is connected to the second polar plate of the storage capacitor.

In an embodiment, the method further comprises the step of, prior to forming the first polar plate of the storage capacitor, forming a pattern of a passivation layer by a patterning process, wherein a thickness of a part of the passivation layer in the display area is larger than a thickness of another part of the passivation layer in the transparent area.

In an embodiment, the method further comprises the steps of, after forming the first polar plate of the storage capacitor, forming a pattern including a pixel define layer in the display area by a patterning process, forming a first insulating layer in the transparent area and forming a via hole in the first insulating layer, forming a pattern including a light-emitting layer of the organic electroluminescence device in the display area, and forming a pattern including the second polar plate of the storage capacitor and the cathode of the organic electroluminescence device by an evaporation process, wherein the second polar plate of the storage capacitor is connected to the connection electrode through the via hole, and the second polar plate of the storage capacitor is arranged separately from the cathode of the organic electroluminescence device.

In an embodiment, the method further comprises the steps of, after forming the first polar plate of the storage capacitor, forming a first insulating layer, forming a pattern including the connecting electrode and the anode of the organic electroluminescence device by a patterning process, forming a pattern including a pixel define layer in the display area by a patterning process, and forming a via hole in the first insulating layer in the transparent area, forming a pattern including a light-emitting layer of the organic electroluminescence device in the display area, and forming a pattern including the second polar plate of the storage capacitor and the cathode of the organic electroluminescence device by an evaporation process, wherein the second polar plate of the storage capacitor is connected to the connection electrode through the via hole, and the second polar plate of the storage capacitor is arranged separately from the cathode of the organic electroluminescence device.

According to an embodiment of the present invention, there is provided an array substrate which comprises the above pixel structure.

According to an embodiment of the present invention, there is provided a display device which comprises the above array substrate.

REFERENCE NUMBER

1: Substrate; 2: Buffer Layer; 3: First Polar Plate; 4: First Insulating Layer; 5: Connection Electrode; 6: Pixel Define Layer; 7: Second Polar Plate; M1: Switch Transistor; M2: Drive Transistor; D1: Organic Electroluminescence Device; Cs: Storage Capacitor; Q1: Transparent Area; Q2: Display Area.

DETAILED DESCRIPTION

To facilitate those skilled in the art to well understand the concept of the present invention, several embodiments of the present invention will be described in detail in conjunction with the drawings.

First Embodiment

The embodiment provides a pixel structure which comprises a display area and a transparent area. The pixel structure further comprises a pixel circuit which includes an organic electroluminescence device and at least one storage capacitor. The organic electroluminescence device is arranged in the display area, and the at least one storage capacitor is arranged in the transparent area. A first polar plate and a second polar plate of the respective storage capacitors are both made of a transparent conductive material. The two polar plates are electrically isolated by at least a dielectric layer.

As in the pixel structure of this embodiment, the material for the storage capacitor is the transparent conductive material and the storage capacitor is arranged in the transparent area, which means that the place where the storage capacitor is arranged is transparent for the light, the transparency of the pixel structure can be improved. In other words, the display area in the pixel structure of this embodiment can be relatively decreased, and accordingly the transparent area can be relatively increased. Therefore the pixel structure of this embodiment has a high transparency. Moreover the pixel structure can be used in a display panel, and thus the display panel has a high aperture ratio. Furthermore, at least one storage capacitor is arranged in the transparent area, so the size of the display area of the pixel structure can be decreased appropriately, and thus the whole size of the pixel structure can be decreased. Therefore, compared with the existing display panel, the display panel of the embodiment is capable of deploying more pixel structures and thus the resolution of the display panel can be further improved.

In some embodiments of the present invention, the first polar plate and the anode of the organic electroluminescence device are arranged at the same layer and are made of the same material. Therefore, the first polar plate and the anode of the organic electroluminescence device may be formed in the same patterning process, so as to reduce the number of the patterning processes and save the cost. Alternatively, the anode of the organic electroluminescence device may be a film formed by a transparent conductive material. The transparent conductive material may be one of Indium Tin Oxide (ITO), Indium Zinc Oxide (IZO), Indium Gallium Zinc Oxide (IGZO) or Indium Gallium Tin Oxide (InGaSnO).

It should be noted that the expression "be arranged at the same layer" in some embodiments means that the different structures are formed in the same patterning process, but not mean that these structures are formed in the absolutely same plane visually.

In some embodiments of the present invention, a first insulating layer is arranged under the layer at which the anode of the organic electroluminescence device is arranged and in at least the transparent area. The first polar plate is arranged under the first insulating layer. In other words, the anode of the organic electroluminescence device may not be arranged at the same layer as the first polar plate. In this case, the first polar plate and the anode of the organic electroluminescence device are manufactured individually, which may be realized by adding one patterning process. Alternatively, the material for the first insulating layer may be a material with a high dielectric constant, such as Silicon Nitride, Silicon Oxide, etc. to increase its storage capacity.

In some embodiments of the present invention, the pixel structure further comprises a connection electrode which is electrically connected to the second polar plate of the storage capacitor.

Generally the pixel structure comprises a transistor which is connected to a drive power supply. Some connection lines would be formed at the same time when the respective film layers of the transistor are formed, so that the transistor can be connected to the drive power supply via the connection lines. Therefore in some embodiments, the connection between the second polar plate of the storage capacitor and the drive power supply may be realized by means of the connection between the connection electrode and the connection lines.

In some embodiments, the connection electrode and the anode of the organic electroluminescence device are arranged at the same layer and are made of the same material. In this way, the number of patterning processes can be reduced and the cost can be saved. Of course, it will be also appreciated that the connection electrode and the anode of the organic electroluminescence device may be manufactured individually by adding one patterning process.

In some embodiments, there is a step between a part of at least one layer structure in the display area and another part in the transparent area, under the layer at which the cathode of the organic electroluminescence device is arranged. With respect to a pixel define layer, for example, arranged between the layer of the cathode of the organic electroluminescence device and the layer of the anode, a thickness of a part of the pixel define layer in the display area is larger than that of another part in the transparent area (in some embodiments, it is possible to arrange no pixel define layer in the transparent area), so there is a step between the part of the pixel define layer in the display area and the part in the transparent area. Due to the step and the cathode with small thickness, when forming a cathode material film layer of the organic electroluminescence device on the pixel define layer by an evaporation process, the cathode material film layer is broken between the display area and the transparent area, and no continuous structure is formed. In this case, the cathode material film layer in the display area may be formed as the cathode of the organic electroluminescence device, while the cathode material film layer in the transparent area may be formed as the second polar plate of the storage capacitor. That is, the same patterning process may be used to form the pattern including the cathode of the organic electroluminescence device and the second polar plate of the storage capacitor, which may reduce the manufacture cost of the display panel and improve the manufacture efficiency.

In some embodiments, the second polar plate of the storage capacitor and the cathode are arranged at the same layer and are made of the same material. Of course, it will be also appreciated that the second polar plate of the storage capacity and the cathode of the organic electroluminescence device may be manufactured individually by adding one patterning process.

In some embodiments, in order to form the cathode of the organic electroluminescence device and the second polar plate of the storage capacitor in the same evaporation process, the pixel structure further comprises a passivation layer which is arranged below the anode of the organic electroluminescence device. The thickness of a part of the passivation layer in the display area is larger than that of a part of the passivation layer in the transparent area. Thus there is a step between the part of the passivation layer in the display area and the part in the transparent area. Due to the step, the second polar plate of the storage capacitor and the cathode of the organic electroluminescence device may be incontinuous in the same evaporation process. Therefore the second polar plate of the storage capacitor and the cathode of the organic electroluminescence device are arranged at the same layer and are made of the same material. Thus, the number of patterning processes can be reduced and the cost can be saved. It should be noted that the passivation layer may not be arranged in the transparent area, and thus there is a high step between a part of the layer at which the cathode of the organic electroluminescence device is to be arranged in the display area and another part in the transparent area, so as to form the cathode and the second polar plate better in the same evaporation process.

The pixel structure of the embodiments of the present invention is applicable to top-emitting organic electroluminescence devices and bottom-emitting organic electroluminescence devices, and requires arranging a reflection electrode away from the light-emitting side of the organic electroluminescence device, which is not described in detail herein.

In some embodiments, the dielectric layer comprises at least one of the first insulating layer, the pixel define layer and a planarization layer, which will be described in detail later.

The present embodiment also provides a manufacturing method for the pixel structure. The pixel structure comprises a display area, a transparent area and a pixel circuit which includes an organic electroluminescence device and at least one storage capacitor. Specifically, the method comprises a step of forming the organic electroluminescence device in the display area, and a step of forming the at least one storage capacitor in the transparent area. The first polar plate and second polar plate of the storage capacitor are both made of a transparent conductive material, and the two polar plates are electrically isolated by a dielectric layer.

As the storage capacitor manufactured by the manufacturing method of the present embodiment is arranged in the transparent area, which means that the place where the storage capacitor is arranged is transparent for the light, the transparency of the pixel structure can be improved. The display area in the pixel structure of this embodiment can be relatively decreased, and accordingly the transparent area can be relatively increased. Therefore the pixel structure of this embodiment has a high transparency. Moreover the pixel structure can be used in a display panel, and thus the display panel has a high aperture ratio. Furthermore, at least one storage capacitor is arranged in the transparent area, so the size of the display area of the pixel structure can be decreased appropriately, and thus the whole size of the pixel structure can be decreased. Therefore, compared with the existing display panel, the display panel of the embodiment is capable of deploying more pixel structures and thus the resolution of the display panel can be further improved.

The embodiment will be described in the following taking the pixel circuit 2T1C as an example. Of course, the present embodiment is not limited to the specific structure of the pixel structure, which means that the embodiments of the present invention are not limited to the pixel circuit 2T1C, and any other pixel circuit such as 6T2C, 7T2C etc. may also be used.

Figure 1:
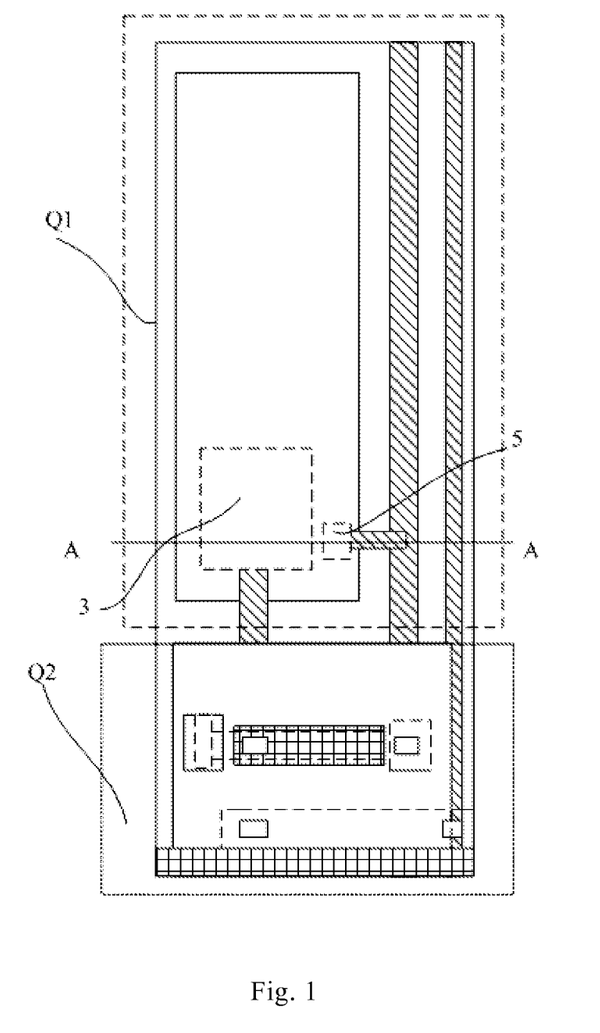
FIG. 1 is a top view of the pixel structure according to a first embodiment of the present invention.
Figure 2:
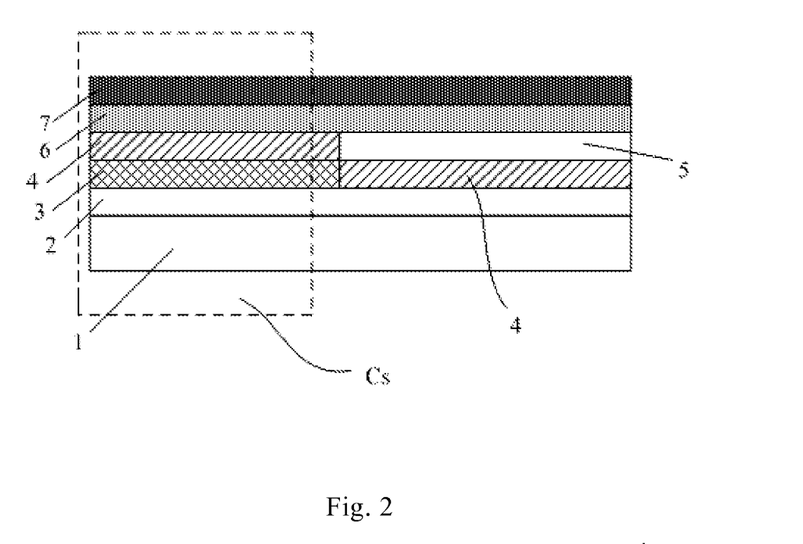
FIG. 2 is a section view of the pixel structure as shown in FIG. 1 along line A-A.
Figure 3:
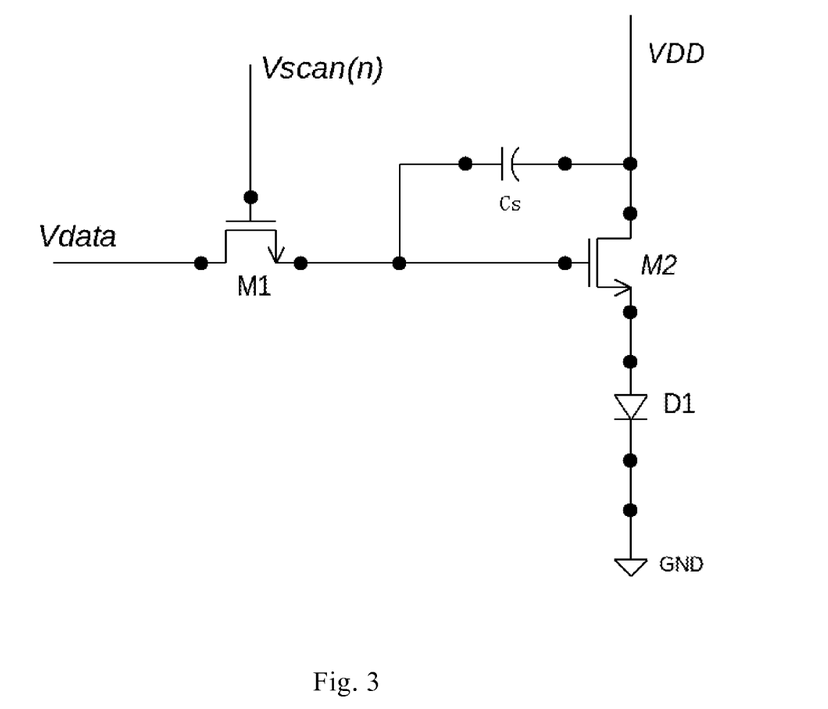
FIG. 3 is a schematic circuit diagram of the pixel structure of the array substrate according to the first embodiment of the present invention.
Figure 4:
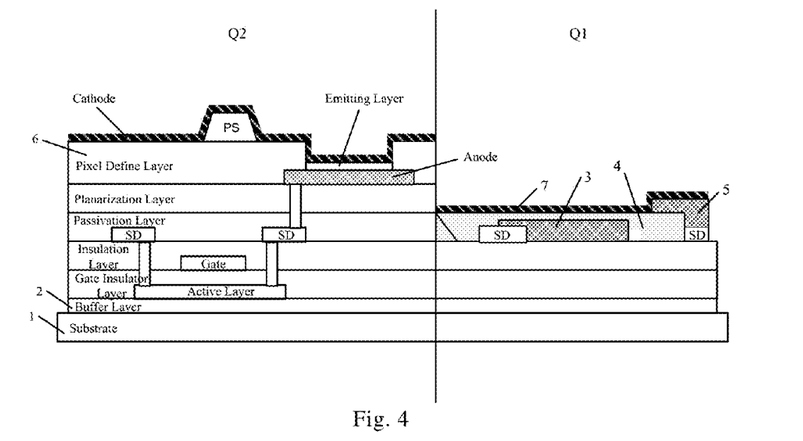
FIG. 4 is a section view of a pixel structure according to an example embodiment of the present disclosure.
Figure 5A:
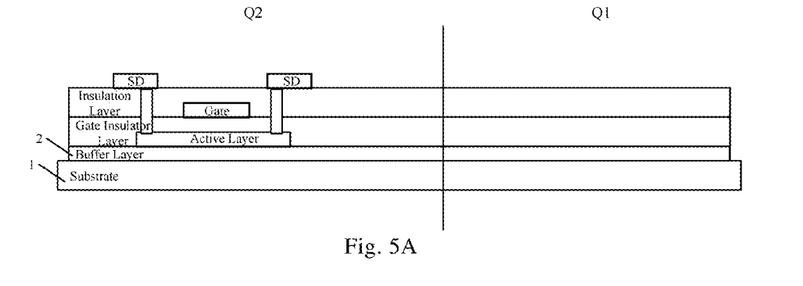
FIGS. 5A to 5F are section views illustrating a process of manufacturing a pixel structure according to another example embodiment of the present disclosure.
Figure 5B:
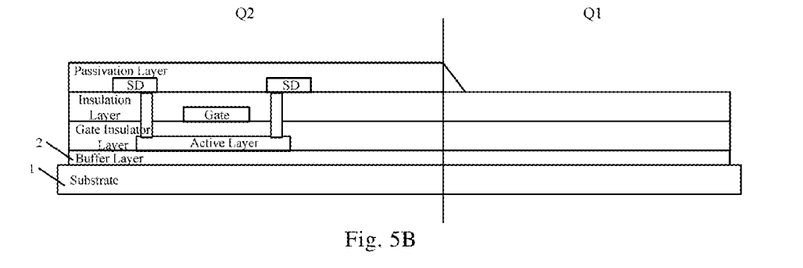
Figure 5C:
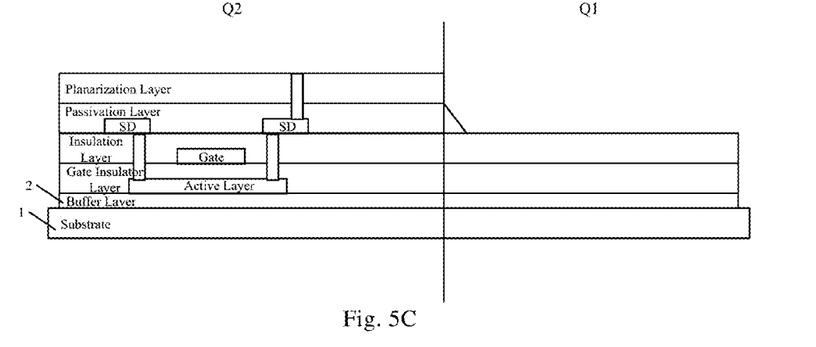
Figure 5D:
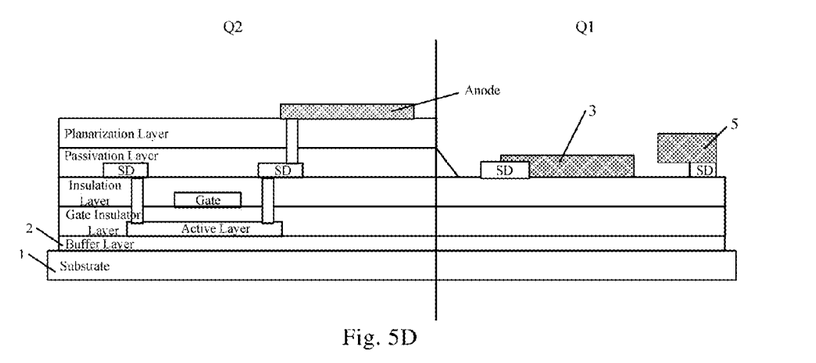
Figure 5E:
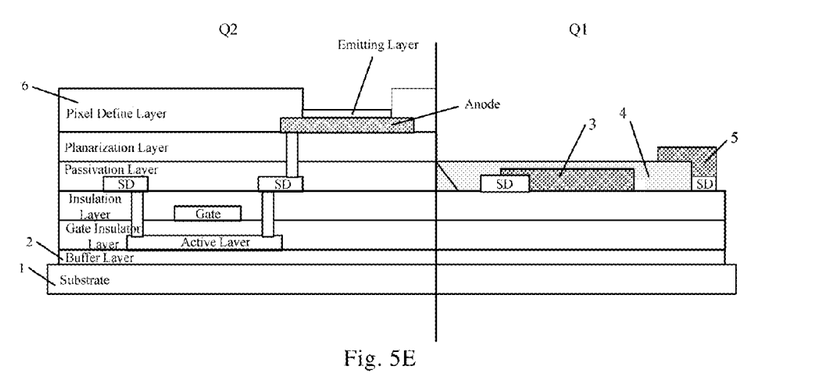
Figure 5F:
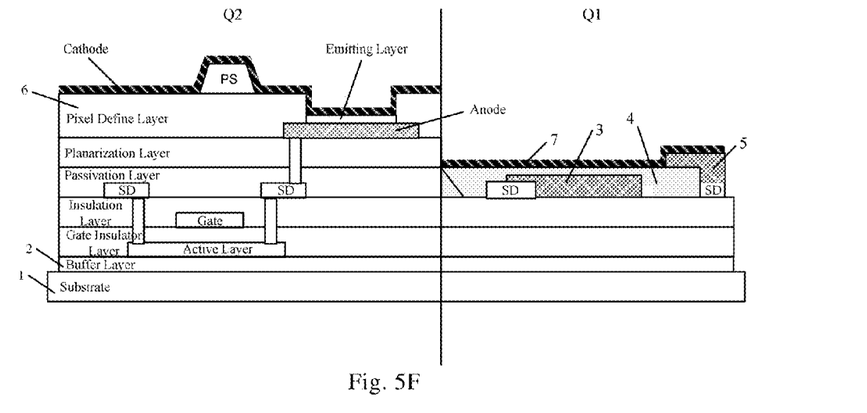
Figure 6:
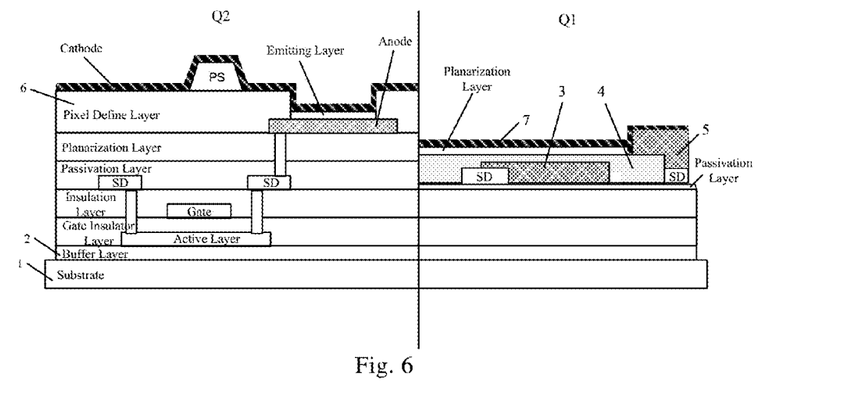
FIG. 6 is a section view of a pixel structure according to another example embodiment of the present disclosure.
Figure 7A:
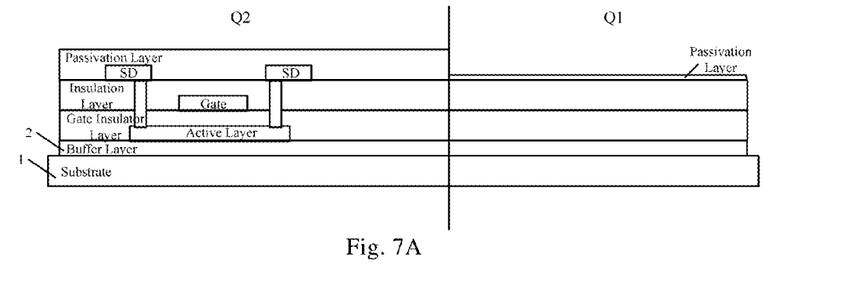
FIGS. 7A to 7F are section views illustrating another process of manufacturing a pixel structure according to another example embodiment of the present disclosure.
Figure 7B:
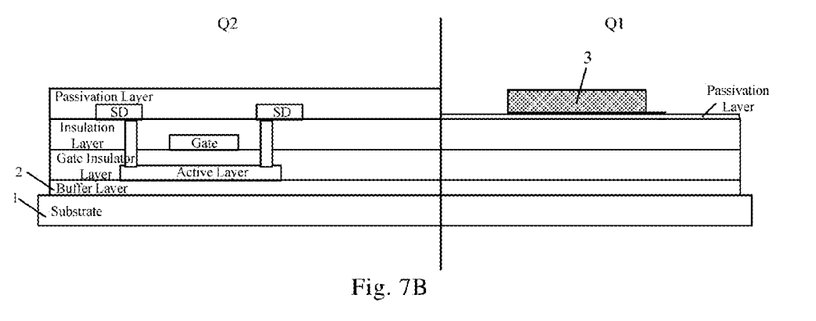
Figure 7C:
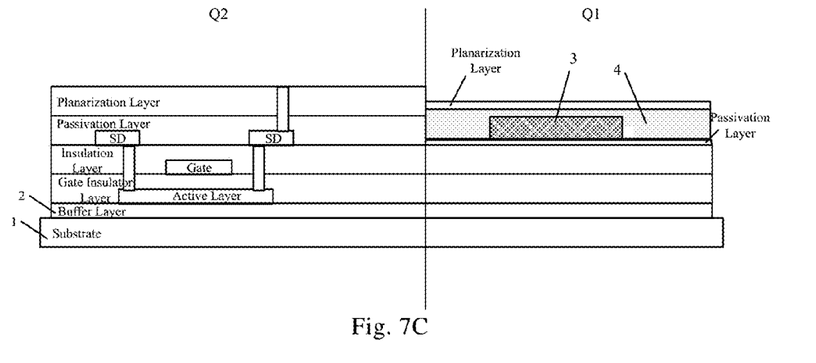
Figure 7D:
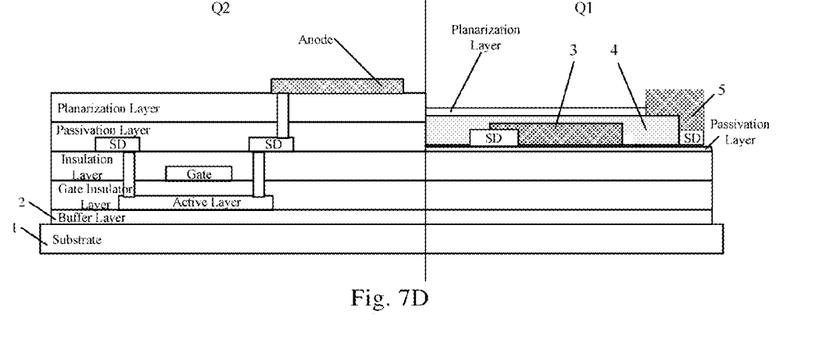
Figure 7E:
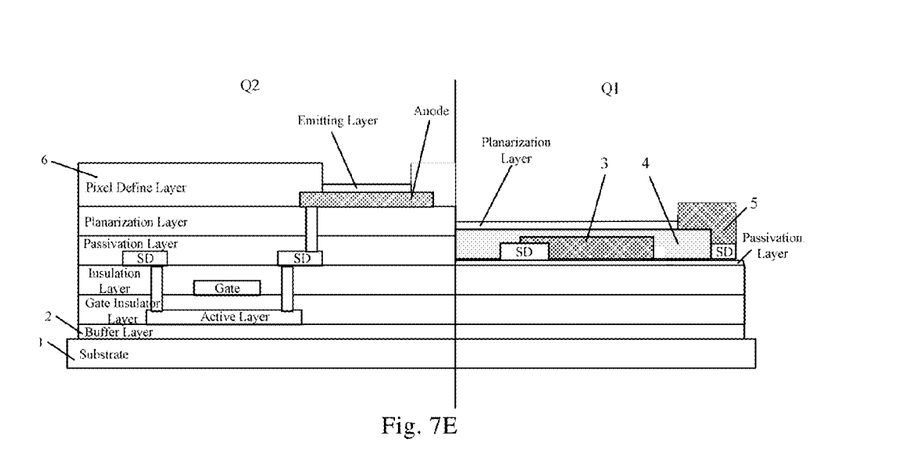
Figure 7F:
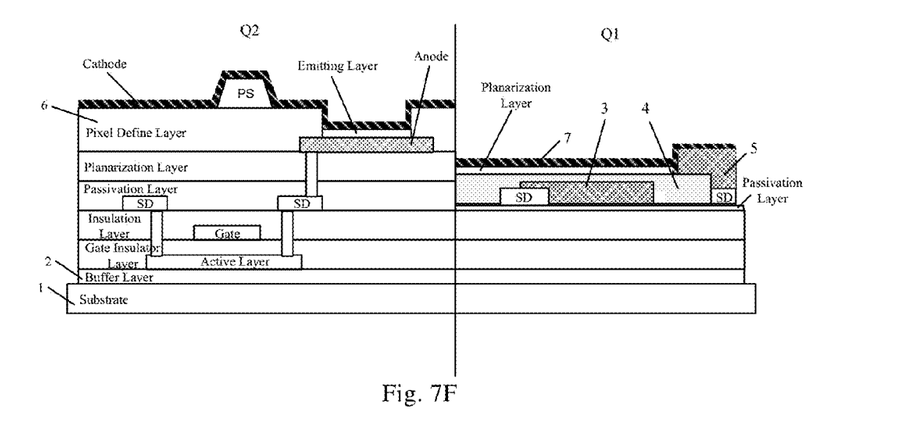

Referring to FIGS. 1-7, the present embodiment provides a manufacturing method for the pixel structure. The pixel structure includes a switch transistor M1, a drive transistor M2 and an organic electroluminescence device D1 which are arranged in the display area Q2, and a storage capacitor Cs which is arranged in the transparent area Q1. As shown in FIGS. 4, 5A-5F, 6 and 7A-7F, the manufacturing method comprises the following steps:

Step I: a buffer layer 2 is formed on the substrate 1, using Plasma Enhanced Chemical Vapor Deposition (PECVD), Low Pressure Chemical Vapor Deposition (LPCVD), Atmospheric Pressure Chemical Vapor Deposition (APCVD), or Electron Cyclotron Resonance Chemical Vapor Deposition (ECR-CVD).

The buffer layer 2 may be made of a material similar to a lattice structure of silicon, which facilitates formation of a-Si film (i.e., amorphous silicon film in the next step) on the buffer layer 2.

Step II: the amorphous silicon film is formed on the substrate 1 obtained after the previous step, and is crystallized to form a polysilicon film, then the polysilicon film is doped, and a pattern including the active layers of the switch transistor M1 and drive transistor M2 is formed using the same patterning process.

In this step, firstly the amorphous silicon film (a-Si) is formed on the buffer layer 2 by means of the deposition which includes PECVD and LPCVD.

Next, the amorphous silicon film is crystallized. The crystallization may include excimer laser crystallization, metal induced crystallization or solid phase crystallization. The amorphous silicon film may be converted into the polysilicon film (p-Si). Then the polysilicon film (p-Si) is doped (e.g. P-doped or N-doped) to determine the conductive type of channel region of the thin film transistor (TFT). The excimer laser crystallization and the metal induced crystallization are two conventional kinds of method for low-temperature polysilicon preparation, which may convert the amorphous silicon film into the polysilicon film. However, the embodiments of the present invention is not limited to the low-temperature polysilicon preparation, any other method for converting the active layers of the switch transistor M1 and drive transistor M2 into the required polysilicon film can be employed.

Finally the pattern including the active layers of the switch transistor M1 and drive transistor M2 is formed using the same patterning process. Specifically, a layer of photoresist is formed on the polysilicon film, and the photoresist is exposed and developed. Then the polysilicon film is etched to form the pattern including the active layers of the switch transistor M1 and drive transistor M2.

Step III: a gate insulator layer and a pattern of gate are formed sequentially on the substrate 1 obtained after the previous steps.

In this step, firstly the gate insulator layer is formed by means of Plasma Enhanced Chemical Vapor Deposition, Low Pressure Chemical Vapor Deposition, Atmospheric Pressure Chemical Vapor Deposition or Electron Cyclotron Resonance Chemical Vapor Deposition or sputtering. Then a gate metal film is formed using sputtering, thermal evaporation, Plasma Enhanced Chemical Vapor Deposition, Low Pressure Chemical Vapor Deposition, Atmospheric Pressure Chemical Vapor Deposition or Electron Cyclotron Resonance Chemical Vapor Deposition. Finally, the pattern including the gate is formed using a patterning process.

Step IV: a pattern (SD) including a source and a drain of the switch transistor M1 and a source and a drain of the drive transistor M2 is formed on the substrate 1 obtained after the previous steps.

In this step, firstly a source drain metal film is formed using sputtering, thermal evaporation, Plasma Enhanced Chemical Vapor Deposition (PECVD), Low Pressure Chemical Vapor Deposition (LPCVD), Atmospheric Pressure Chemical Vapor Deposition (APCVD) or Electron Cyclotron Resonance Chemical Vapor Deposition (ECR-CVD). Then the pattern including the source and drain of the switch transistor M1 and the source and drain of the drive transistor M2 is formed using the patterning process.

Alternatively, when the pattern including the source and drain of the switch transistor M1 and the source and drain of the drive transistor M2 is formed, a first electrode lead connected to the drain of the switch transistor M1, a second electrode lead connected to the source of the drive transistor M2, and a third electrode lead connected to the drain of the drive transistor M2 are formed.

Step IV: a passivation layer is formed on the substrate 1 obtained after the previous steps.

It should be noted that, in the present embodiment, the passivation layer is only arranged in the display area Q2, but the passivation layer may covers both the display area Q2 and the transparent area Q1, and the thickness of the passivation layer in the display area Q2 is greater than that in the transparent area Q1. A via hole for connecting the anode of the organic electroluminescence device to the third electrode lead and a via hole for connecting the first polar plate 3 of the storage capacitor Cs to the first electrode lead should be formed subsequently. If the passivation layer is only arranged in the display area Q2, there will be a high step between the display area Q2 and the transparent area Q1, which thus facilitates formation of the cathode of the organic electroluminescence device and the second polar plate 7 of the storage capacitor.

Step V: a transparent conductive film is deposited on the substrate 1 obtained after the previous steps, using sputtering, thermal evaporation, Plasma Enhanced Chemical Vapor Deposition, Low Pressure Chemical Vapor Deposition, Atmospheric Pressure Chemical Vapor Deposition or Electron Cyclotron Resonance Chemical Vapor Deposition. The material for the transparent conductive film may be Indium Tin Oxide (ITO), Indium Zinc Oxide (IZO), Indium Gallium Zinc Oxide (IGZO) or Indium Gallium Tin Oxide (InGaSnO). Then a pattern including the first polar plate 3 of the storage capacitor Cs is formed in the transparent area Q1 using the patterning process.

Step VI: the first insulating layer 4 is formed on the substrate 1 obtained after the previous steps, using Plasma Enhanced Chemical Vapor Deposition, Low Pressure Chemical Vapor Deposition, Atmospheric Pressure Chemical Vapor Deposition or Electron Cyclotron Resonance Chemical Vapor Deposition. The first insulating layer 4 may be a first layer structure of the dielectric layer, and covers at least the transparent area Q1 so as to insulate the subsequently formed second polar plate 7 from the first polar plate 3. Alternatively, a via hole is formed at the position corresponding to the connection electrode 5 in the first insulating layer 4. Alternatively, the material of the first insulating layer may be a material with a high dielectric constant, such as Silicon Nitride, Silicon Oxide, etc. to increase its storage capacity.

It will be appreciated that the step of preparing the first insulating layer individually may be omitted in order to simplify the process. The dielectric layer may be formed using at least one of the subsequently formed planarization layer and pixel define layer.

Step VII: a pattern of the planarization layer is formed on the substrate 1 obtained after the previous steps, using Plasma Enhanced Chemical Vapor Deposition, Low Pressure Chemical Vapor Deposition, Atmospheric Pressure Chemical Vapor Deposition or Electron Cyclotron Resonance Chemical Vapor Deposition. The planarization layer may cover at least the display area Q2. In some embodiments, the planarization layer may cover the display area Q2 only, so that there is a high step between the display area Q2 and the transparent area Q1. If the planarization layer is also formed in the transparent area Q1, the planarization layer may be used as a second layer structure of the dielectric layer.

Step VIII: a pattern including the anode of the organic electroluminescence device is formed in the display area Q2 by the patterning process on the substrate 1 obtained after the previous steps.

Specifically a conductive metal film, such as Indium Tin Oxide (ITO), Indium Zinc Oxide (IZO), Indium Gallium Zinc Oxide (IGZO) or Indium Gallium Tin Oxide (InGaSnO), is deposited using sputtering, thermal evaporation, or Plasma Enhanced Chemical Vapor Deposition, Low Pressure Chemical Vapor Deposition, Atmospheric Pressure Chemical Vapor Deposition or Electron Cyclotron Resonance Chemical Vapor Deposition. It will be appreciated that the conductive metal film may be formed by any inorganic metal oxide, organic conductive polymer or metal material with conductive performance and high value of work function. The inorganic metal oxide may be Indium Tin Oxide or Zinc Oxide, the organic conductive polymer may be PEDOT:SS or PANI, and the metal material may be gold, copper, silver or platinum. Then a pattern including the anode of the organic electroluminescence device is formed by exposing, developing and etching the conductive metal film.

In some embodiments, when the pattern including the anode of the organic electroluminescence device D1 is formed in the display area D2, a pattern including the connection electrode 5 is formed in the display area Q2. The connection electrode 5 is connected to the second electrode lead, so that the second electrode lead may electrically contact with the second polar plate 7 of the storage capacitor Cs better.

Step IX: the pixel define layer 6 (PDL) is prepared on the substrate 1 obtained after the previous steps. Then an emitting layer (EL) is evaporated and coated. Alternatively, the pixel define layer 6 may not be arranged in the transparent area Q1. However if the pixel define layer 6 is arranged in the transparent area Q1, the pixel define layer 6 may be used as a third layer structure of the dielectric layer.

Step X: a pattern including the cathode of the organic electroluminescence device D1 and the second polar plate 7 of the storage capacitor Cs is formed on the substrate 1 obtained after the previous steps, using the same evaporation process. The second polar plate 7 of the storage capacitor Cs and the cathode of the organic electroluminescence device D1 may be made of at least one of Lithium, Magnesium, Calcium, Strontium, Aluminum, and Indium. The second polar plate 7 of the storage capacitor Cs may be connected to the connection electrode 5 through the via hole formed in the dielectric layer above the connection electrode 5, or connected to the connection electrode 5 directly and in turn connected to the drive power supply through the second electrode lead.

In some embodiments, no passivation layer is formed in the transparent area Q1 of the pixel structure. Alternatively, no planarization layer and pixel define layer 6 may be formed. In this case, there is a high step between the display area Q2 and the transparent area Q1, and thus the pattern of the cathode of the organic electroluminescence device D1 in the display area Q2 and the pattern of the second polar plate 7 of the storage capacitor Cs in the transparent area Q1 are incontinuous. Furthermore, it can be seen from the above embodiments that the structure of the dielectric layer may comprise at least one of the first insulating layer 4, the pixel define layer 6 and the planarization layer. It will be appreciated that, considering the capacity of the storage capacitor, the dielectric layer may comprise only one of the first insulating layer 4, the pixel define layer 6 and the planarization layer. In this way, the capacity of the storage capacitor formed is relatively large. In some embodiments, the dielectric layer includes only the first insulating layer which may be made of a material with high dielectric constant, such as Silicon Nitride, Silicon Oxide, etc.

In some embodiments, the first polar plate 3 and second polar plate 7 of the storage capacitor Cs may both be made of the transparent material, which may increase the transparency of the pixel structure greatly.

It should be noted that in the above embodiments the pixel structure which includes a top-gate thin film transistor is described for example, but the manufacturing method for a pixel structure which includes a bottom-gate thin film transistor is similar, except that the order for preparing the gate and the active layer is converse, which will not be described herein.

In some embodiments, the anode of the organic electroluminescence device D1 and the first polar plate 3 of the storage capacitor Cs may be formed using the same patterning process. In this case, the step VIII may be omitted, and the anode of the organic electroluminescence device D1 may be formed when the first polar plate 3 is formed in step V.

The method for manufacturing a pixel structure disclosed in the embodiments of the present invention is applicable to top-emitting organic electroluminescence devices and bottom-emitting organic electroluminescence devices, and the reflection electrode is formed away from the light-emitting side of the organic electroluminescence device, which is not described in detail herein.

Accordingly, the present embodiment further provides an array substrate which comprises the above-described pixel structure.

Second Embodiment

This embodiment provides a display apparatus which comprises the array substrate of the first embodiment. The display device may be any product or component with display function, such as mobile phone, tablet PC, television set, display device, notebook, digital photo frame, navigation equipment, etc.

The display apparatus of the present embodiment comprises the array substrate of the first embodiment, so the display effect can be better.

Of course, the display apparatus of the present embodiment may also comprise other conventional parts, such as a display drive unit.

It will be appreciated that the above embodiments are illustrative to explain the principles of the present invention. However the present invention is not limited hereto. Without departing from the spirit and essence of the present inven-

What is claimed is:

1. A pixel structure comprising:
a display area;
a transparent area; and
a pixel circuit which includes an organic electroluminescence device and at least one storage capacitor;
wherein the organic electroluminescence device of the pixel circuit is arranged in the display area;
wherein the at least one storage capacitor of the pixel circuit is arranged in the transparent area;
wherein a first polar plate and a second polar plate of the storage capacitor are both made of a transparent conductive material, and the first and second polar plates are electrically isolated by at least a dielectric layer; and
wherein the first polar plate of the storage capacitor and an anode of the organic electroluminescence device are arranged at the same layer and are made of the same material.

2. The pixel structure according to claim 1, wherein a first insulating layer is arranged under the layer at which the anode of the organic electroluminescence device is arranged and in at least the transparent area, and wherein the first polar plate of the storage capacitor is arranged under the first insulating layer.

3. The pixel structure according to claim 1 further comprising a connection electrode electrically connected to the second polar plate of the storage capacitor, wherein the connection electrode and the anode of the organic electroluminescence device are arranged at the same layer and are made of the same material.

4. The pixel structure according to claim 1 wherein there is a step between a part of at least one layer structure in the display area and another part of the at least one layer structure in the transparent area, under a layer at which a cathode of the organic electroluminescence device is arranged.

5. The pixel structure according to claim 4 wherein the second polar plate of the storage capacitor and the cathode of the organic electroluminescence device are separately arranged at the same layer and are made of the same material.

6. The pixel structure according to claim 1, further comprising a passivation layer which is arranged below the anode of the organic electroluminescence device, wherein a thickness of a part of the passivation layer in the display area is larger than a thickness of another part of the passivation layer in the transparent area.

7. The pixel structure according to claim 1 wherein the dielectric layer comprises at least one of a first insulating layer, a pixel define layer and a planarization layer.

8. A manufacturing method for a pixel structure, the pixel structure comprising a display area, a transparent area and a pixel circuit which includes an organic electroluminescence device and at least one storage capacitor, the manufacturing method comprising:
forming the organic electroluminescence device in the display area; and
forming the at least one storage capacitor in the transparent area;
wherein a first polar plate and a second polar plate of the storage capacitor are both made of a transparent conductive material, and the first and second polar plates are electrically isolated by a dielectric layer; and
wherein an anode of the organic electroluminescence device and the first polar plate of the storage capacitor are formed in the same patterning process.

9. The manufacturing method according to claim 8, wherein a pattern of a connection electrode is formed when the anode of the organic electroluminescence device is formed, and wherein the connection electrode is connected to the second polar plate of the storage capacitor.

10. The manufacturing method according to claim 8, further comprising:
prior to forming the first polar plate of the storage capacitor, forming a pattern of a passivation layer by a patterning process, wherein a thickness of a part of the passivation layer in the display area is larger than a thickness of another part of the passivation layer in the transparent area.

11. The manufacturing method according to claim 10, further comprising:
after forming the first polar plate of the storage capacitor:
forming a pattern including a pixel define layer in the display area by a patterning process, forming a first insulating layer in the transparent area and forming a via hole in the first insulating layer;
forming a pattern including a light-emitting layer of the organic electroluminescence device in the display area; and
forming a pattern including the second polar plate of the storage capacitor and a cathode of the organic electroluminescence device by an evaporation process, wherein the second polar plate of the storage capacitor is connected to the connection electrode through the via hole, and the second polar plate of the storage capacitor is arranged separately from the cathode of the organic electroluminescence device.

12. The manufacturing method according to claim 8, further comprising:
after forming the first polar plate of the storage capacitor:
forming a first insulating layer;
forming a pattern including a connection electrode by a patterning process;
forming a pattern including a pixel define layer in the display area by a patterning process, and forming a via hole in the first insulating layer in the transparent area;
forming a pattern including a light-emitting layer of the organic electroluminescence device in the display area; and
forming a pattern including the second polar plate of the storage capacitor and a cathode of the organic electroluminescence device by an evaporation process, wherein the second polar plate of the storage capacitor is connected to the connection electrode through the via hole, and the second polar plate of the storage capacitor is arranged separately from the cathode of the organic electroluminescence device.

13. An array substrate comprising a pixel structure according to claim 1.

14. A display device comprising an array substrate according to claim 13.

15. The array substrate according to claim 13 wherein the pixel structure further comprises a connection electrode electrically connected to the second polar plate of the storage capacitor, wherein the connection electrode and the anode of the organic electroluminescence device are arranged at the same layer and are made of the same material.

16. The array substrate according to claim 13, wherein in the pixel structure a first insulating layer is arranged under a layer at which the anode of the organic electroluminescence device is arranged and in at least the transparent area, and wherein the first polar plate of the storage capacitor is arranged under the first insulating layer.

17. The array substrate according to claim 13 wherein there is a step between a part of at least one layer structure in the display area and another part of the at least one layer structure in the transparent area, under a layer at which a cathode of the organic electroluminescence device is arranged.

* * * * *